(12) United States Patent
Shen

(10) Patent No.: US 10,658,248 B2
(45) Date of Patent: May 19, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Zhao Xu Shen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/008,756

(22) Filed: Jun. 14, 2018

(65) Prior Publication Data

US 2018/0366376 A1     Dec. 20, 2018

(30) Foreign Application Priority Data

Jun. 16, 2017     (CN) .......................... 2017 1 0457810

(51) Int. Cl.
  *H01L 21/8238*     (2006.01)
  *H01L 29/78*       (2006.01)
  *H01L 29/66*       (2006.01)
  *H01L 21/28*       (2006.01)
  *H01L 21/3115*     (2006.01)
  (Continued)

(52) U.S. Cl.
  CPC .. *H01L 21/823814* (2013.01); *H01L 29/6656* (2013.01); *H01L 29/66575* (2013.01); *H01L 29/7833* (2013.01); *H01L 21/266* (2013.01); *H01L 21/28247* (2013.01); *H01L 21/31111* (2013.01); *H01L 21/31116* (2013.01); *H01L 21/31155* (2013.01); *H01L 29/7848* (2013.01)

(58) Field of Classification Search
  CPC ....... H01L 21/823814; H01L 29/66575; H01L 29/6656; H01L 29/7833; H01L 21/31116; H01L 29/7848; H01L 21/31111; H01L 21/266; H01L 21/31155; H01L 21/28247; H01L 27/0922
  See application file for complete search history.

(56) References Cited

U.S. PATENT DOCUMENTS 5,923,986 A * 7/1999 Shen ..................... H01L 29/665
                                              257/E21.438
6,329,252 B1 * 12/2001 Lin .................. H01L 21/76897
                                              257/E21.507
(Continued)

*Primary Examiner* — Su C Kim
(74) *Attorney, Agent, or Firm* — Anova Law Group, PLLC

(57) ABSTRACT

Semiconductor structures and fabrication methods thereof are provided. An exemplary fabrication method includes providing a base substrate; forming a gate structure over the base substrate; forming a mask layer on a top surface of the gate structure; forming pocket regions in the base substrate at both sides of the gate structure; after forming the pocket regions, forming a first protective portion covering a top surface of the mask layer and protruding from sidewall surfaces of the gate structure; and after forming the first protective portion, forming doped source/drain regions in the base substrate and portions of the pocket regions at both sides of the gate structure.

19 Claims, 5 Drawing Sheets

(51) Int. Cl.
*H01L 21/266* (2006.01)
*H01L 21/311* (2006.01)

(56) References Cited

U.S. PATENT DOCUMENTS

| | | | |
|---|---|---|---|
| 7,002,209 B2* | 2/2006 | Chen | H01L 29/6653 257/336 |
| 2007/0275532 A1* | 11/2007 | Chidambarrao | H01L 21/26513 438/300 |
| 2010/0019323 A1* | 1/2010 | Shin | H01L 21/823814 257/369 |
| 2011/0269283 A1* | 11/2011 | Tien | H01L 29/66659 438/286 |
| 2012/0196422 A1* | 8/2012 | Flachowsky | H01L 21/28518 438/305 |

* cited by examiner

US 10,658,248 B2

SEMICONDUCTOR STRUCTURE AND FABRICATION METHOD THEREOF

CROSS-REFERENCES TO RELATED APPLICATIONS

This application claims the priority of Chinese patent application No. 201710457810.3, filed on Jun. 16, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods thereof.

BACKGROUND

With the continuous development of semiconductor technologies, reducing the critical dimension (CD) of the devices of integrated circuits (ICs) has become one of the major approaches to increase the speed of the devices and to enhance the performances of the ICs. Currently, because semiconductor industry has been advanced to the nanoscale technical node during the path for pursuing high device density, high performance and low cost, especially when the sizes of the semiconductor devices reach nanoscale, the fabrication of the semiconductor devices has to face various challenges caused by the limitations of the principles of physics.

When the sizes of the semiconductor devices reach the nanoscale, the critical dimensions of the gate structures (gate CDs) of the semiconductor devices are correspondingly shrunk. With the continuous reduction of the technique node, the conventional gate dielectric layer has become thinner and thinner; and the leakage currents of the transistors are correspondingly increased; and the power waste issues occur in the semiconductor devices. To solve such issues and avoid high temperature processes, an approach that uses a high-K metal gate structure to substitute the polysilicon gate structure has been provided.

During the high-K/metal gate last process, to increase the carrier mobility, stress layers are often formed in the source/drain regions by an epitaxial growth process. For example, a compressive stress material (such as SiGe) is used in the fabrication of a PMOS device; and a tensile stress material (such as SiC) is used in the fabrication of an NMOS device.

However, during the processes for forming the stress layers, it may be easy to deteriorate the performance of the semiconductor devices. The disclosed methods and semiconductor structures are directed to solve one or more problems set forth above and other problems in the art.

BRIEF SUMMARY OF THE DISCLOSURE

One aspect of the present disclosure includes a method for fabricating semiconductor structure. The method includes providing a base substrate; forming a gate structure over the base substrate; forming a mask layer on a top surface of the gate structure; forming pocket regions in the base substrate at both sides of the gate structure; after forming the pocket regions, forming a first protective portion covering a top surface of the mask layer and protruding from sidewall surfaces of the gate structure; and after forming the first protective portion, forming doped source/drain regions in the base substrate and portions of the pocket regions at both sides of the gate structure.

Another aspect of the present disclosure includes a semiconductor structure. The semiconductor structure includes a base substrate; at least one gate structure formed over the base substrate; a mask layer on a top surface of the gate structure; pocket regions formed in the base substrate at both sides of the gate structure; a first protective portion covering a top surface of the mask layer and protruding from sidewall surfaces of the gate structure; and doped source/drain regions formed in the base substrate and portions of the pocket regions at both sides of the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
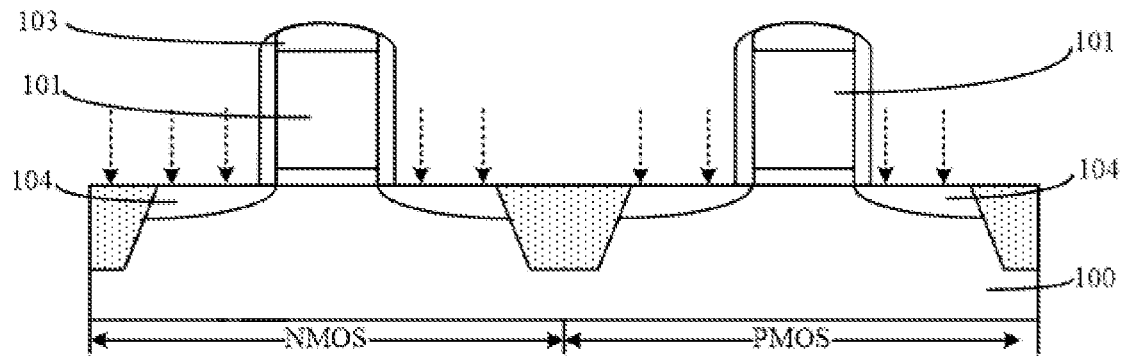
FIGS. 1-2 illustrate structures corresponding to certain stages during a fabrication process of a semiconductor structure.
Figure 2:
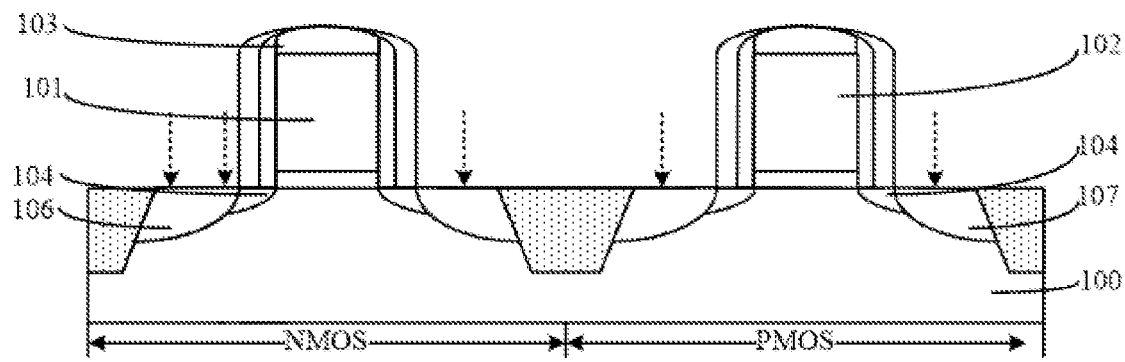

FIGS. 1-2 illustrate structures corresponding to certain stages during a fabrication process of a semiconductor structure.

As shown in FIG. 1, at the beginning of the fabrication process, a base substrate 100 is provided. The base substrate 100 includes an NMOS region and a PMOS region. A plurality of gate structures 101 are formed on the base substrate 100. The plurality of gate structures 101 are on the base substrate 100 in the NMOS region and the base substrate 100 in the PMOS region, respectively. A mask layer 103 is formed on the top surfaces of the gate structures 101. Further, pocket regions 104 are formed in the base substrate 100 at both sides of the gate structures 101.

Further, as shown in FIG. 2, after forming the pocket regions 104, first doped source/drain regions 106 are formed in the base substrate 100 at two sides of the gate structure 101 and portions of the pocket regions 104 in the NMOS region; and second doped source/drain regions 107 are formed in the base substrate 100 at both sides of the gate structure 101 and portions of the pocket regions 104 in the PMOS region.

The mask layer 103 is used to protect the gate electrode structure 101. The mask layer 103 is relatively thin. During the subsequent processes for forming the first doped source/drain regions 106 and the second doped source/drain regions 107, mushroom-shaped defects are easily formed on the gate structures 101.

Before forming the first doped source/drain regions 106, a first cap layer is formed on the base substrate 100 in the PMOS region and the sidewall surfaces and the top surface of the gate structure 101 in the PMOS region. The process for forming the first cap layer includes forming a first cap coating on the base substrate 100 and the sidewall surfaces and the top surfaces of the gate structures 101; and removing the portions of the cap coating on the base substrate 100 in the NMOS region and the sidewall surfaces and the top surface of the gate structure 101 in the NMOS region to form the first cap layer.

During the process for removing the portions of the cap coating on the base substrate 100 in the NMOS region and the sidewall surfaces and the top surface of the gate structure 101 in the NMOS region, the mask layer 103 in the NMOS region is damaged along the direction perpendicular to the surface of the base substrate 100 for the first time.

The process for forming the first doped source/drain regions 106 includes forming first openings in the base substrate 100 in the NMOS region at both sides of the gate structure 101 in the NMOS region; forming a first epitaxial layer in the openings; and doping the first epitaxial layer with N-type ions. During the process for forming the first openings, the mask layer 130 in the NMOS region is damaged along the direction perpendicular to the surface of the base substrate 100 for a second time. Such two time damages cause an over-consumption of the mask layer 103 along the direction perpendicular to the surface of the base substrate 100. Further, the mask layer 103 may be relatively thin. Thus, the top surface of the gate structure 101 in the NMOS region is easily exposed. During the process for forming the first epitaxial layer in the first openings, the exposed portion of the top surface of the gate structure 101 in the NMOS region may also have an epitaxial growth. That is, the mushroom-shaped defects are formed on the gate structure 101 in the NMOS region. The morphological change of the gate structure 101 in the NMOS region may deteriorate the performance of the device in the NMOS region.

Correspondingly, during the process for forming the second doped source/drain regions 107, the gate structure 101 in the PMOS region also has mushroom-shaped defects. The morphological change of the gate structure 101 in the PMOS region may deteriorate the performance of the device in the PMOS region.

To prevent the formation of the mushroom-shaped defects on the gate structures 101, one approach is to increase the thickness of the mask layer 103. However, if the thickness of the mask layer 103 is too large, the depth-to-width ratio of the gaps formed by the adjacent gate structures 101 and the mask layer 103 may be too large. During the ion implantation process for forming the pocket regions 104, the shadow effect to the ions of the ion implantation process may be too large. Thus, it may be difficult for the ions to be implanted into the portions of the base substrate 100 under the gate structures 101; and it may be difficult to form the pocket regions 104; and the quality of the pocket regions 104 may be undesired.

The present disclosure provides a semiconductor structure and a fabrication method thereof. In the disclosed fabrication method, after forming the pocket regions, a first protective portion may be formed on the mask layer. After forming the first protective portion, doped source/drain regions may be formed in the base substrate at both sides of the gate structures. Because the pocket regions may be formed before forming the first protective portion, the pocket regions may be relatively easy to form. Further, because the first protective portion may be formed after forming the pocket regions, during the process for forming the doped source/drain regions, the first protective portion may protect the top surfaces of the gate structures.

Figure 11:
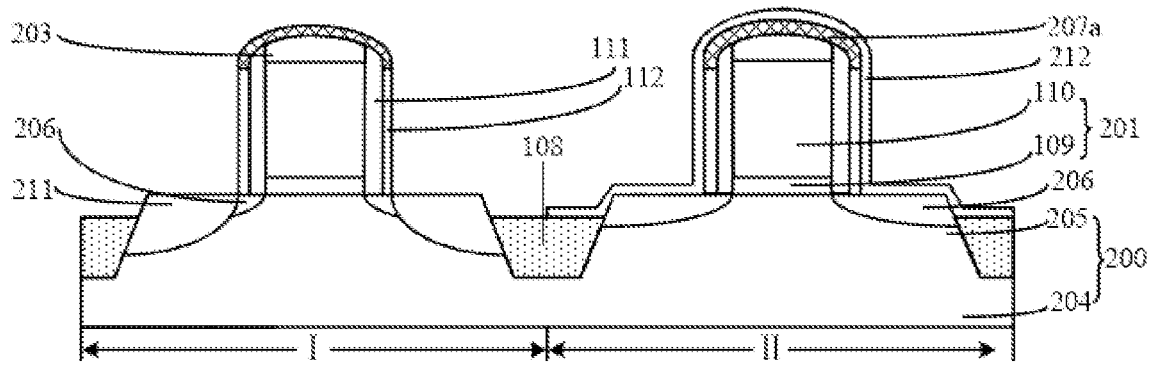
Figure 12:
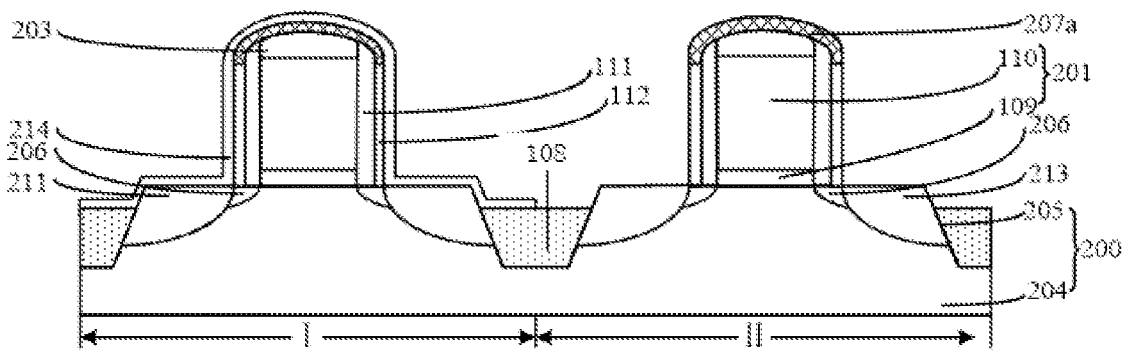
Figure 13:
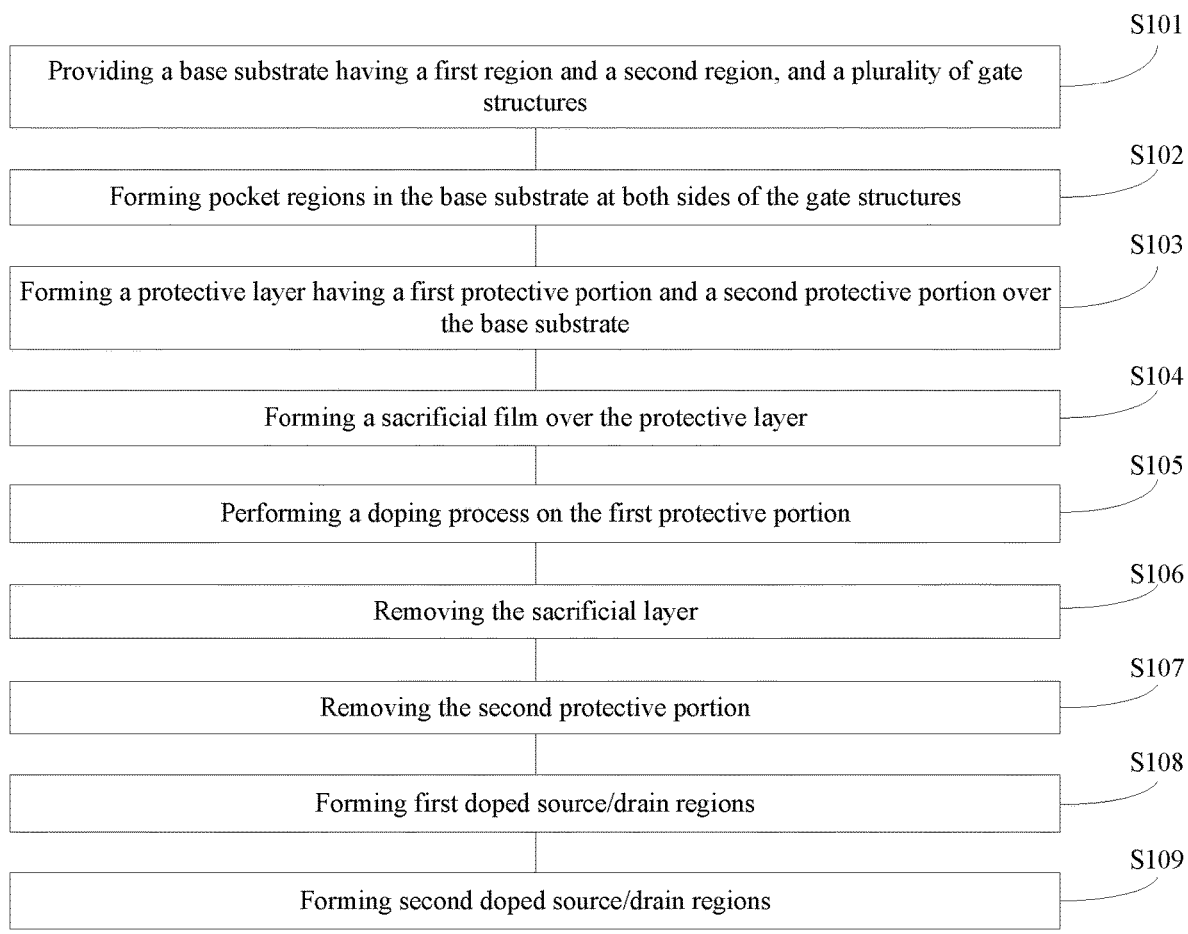
FIG. 13 illustrates an exemplary fabrication process of a semiconductor structure consistent with various disclosed embodiments.

FIG. 13 illustrates an exemplary fabrication process of a semiconductor structure consistent with various disclosed embodiments. FIGS. 3-12 illustrate structures corresponding to certain stages during the exemplary fabrication process.

Figure 3:
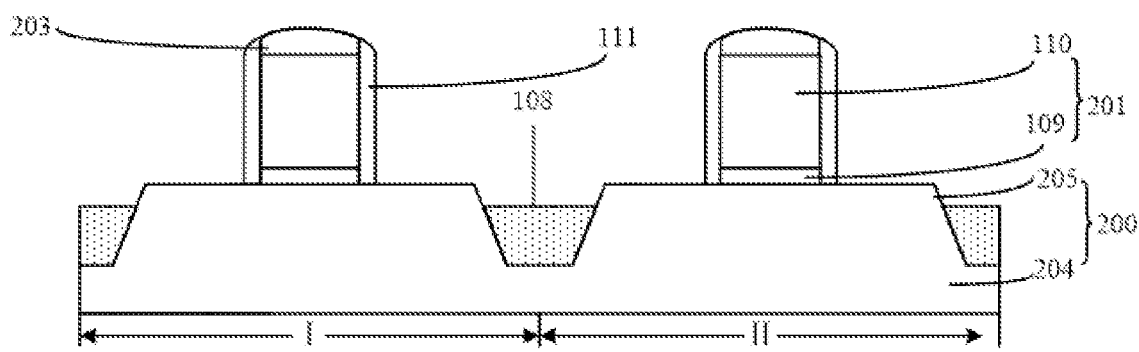
FIGS. 3-12 illustrate structures corresponding to certain stages during an exemplary fabrication process of a semiconductor structure consistent with various disclosed embodiments.

As shown in FIG. 13, at the beginning of the fabrication process, a base substrate with certain structures is provided (S101). FIG. 3 illustrates a corresponding semiconductor structure.

As shown in FIG. 3, a base substrate 200 is provided. A plurality of gate structures 201 may be formed on the base substrate 200; and a mask layer 203 may be formed on the top surfaces of the gate structures 201. In some embodiments, only one gate structure may be formed on the base substrate; and the mask layer may be formed on the top surface of the only one gate structure.

In one embodiment, the base substrate 200 may include a first region I and a second region II. The plurality of gate structures 201 may be formed on the first region I and the second region II of the base substrate 200, respectively. Although two gate structures 201 are shown in FIG. 3, any other number of gate structures may be included in the disclosed semiconductor structure according to various embodiments of the present disclosure.

For illustrative purposes, as shown in FIG. 3, one gate structure 101 is formed on the base substrate 200 in the first region I and one gate structure 101 is formed on the base substrate 200 in the second region II. In some embodiments, the base substrate may only include one region; and one gate structure may be formed on the base substrate.

The first region I of the base substrate 200 may be used to form an NMOS transistor. The second region II of the base substrate 200 may be used to form a PMOS transistor. In some embodiments, the first region of the base substrate may be used to form a PMOS transistor and the second region II of the base substrate may be used to form an NMOS transistor.

In one embodiment, the base substrate 200 includes a semiconductor substrate 204 and a plurality of fins 205 on the semiconductor substrate 204. For illustrative purposes, one fin 205 on the first region I and one fin 205 in the second region II are illustrated and described herein, although any other appropriate number of fins may be included in the disclosed semiconductor structure according to various embodiments of the present disclosure. In some embodiments, the base substrate may also be a planar substrate, such as a silicon substrate, a germanium substrate, or a silicon germanium substrate, etc.

In one embodiment, the fins 205 and the semiconductor substrate 204 are made of silicon. In some embodiments, the fins and the semiconductor substrate may be made of a same material, or different materials. The materials used for forming the fins 205 and the semiconductor substrate 204 may be selected from one or more of germanium and silicon and germanium.

In one embodiment, a process for forming the base substrate 200 may include providing an initial base substrate; and patterning the initial substrate to form the semiconductor substrate 204 and the plurality of the fins 205 on the semiconductor substrate 204.

An isolation structure 108 may be formed on the surface of the semiconductor substrate 204 exposed by the fins 205. The isolation structure 108 may cover the bottom portions of the sidewall surfaces of the fins 205; and the top surface of the isolation structure may be lower than the top surfaces of the fins 205.

In one embodiment, the isolation structure is made of silicon oxide. In some embodiments, the isolation structure may be made of silicon oxynitride, etc.

Each of the gate structures 201 may include a gate dielectric layer 109 on the top portions of the sidewall surfaces of each of the fins 205 and a portion of the top surface of each of the fins 205; and a gate electrode layer 110 on the gate dielectric layer.

In one embodiment, the gate dielectric layer may be made of silicon oxide, etc. The gate electrode layer may be made of silicon, etc.

In one embodiment, the mask layer 203 is made of silicon nitride. In some embodiments, the mask layer may be made of silicon oxynitride, etc.

Various processes may be used to form the mask layer 203, such as a chemical vapor deposition (CVD) process, or a physical vapor deposition (PVD) process, etc. In one embodiment, the mask layer 203 is formed by a CVD process.

The mask layer 203 may be used as an etching mask for forming the gate structures 201. When forming the mask layer 203, the etching rate of the edge regions of the top surface of the mask layer 203 may be greater than the middle regions of the top surface of the mask layer 203. Thus, the vertex angles of the mask layer 203 may be rounded angles; and the thickness of the edge regions of the mask layer 203 may be smaller than the thickness of the middle regions of the mask layer 203, as shown in FIG. 3. The mask layer 203 may also be used to protect the top surfaces of the gate structures 201.

In one embodiment, the thickness of the mask layer 203 may be in a range of approximately 3 nm-25 nm. If the thickness of the mask layer 203 is smaller than approximately 3 nm, the morphology of the gate structures 201 may be undesirable. If the thickness of the mask layer 203 is greater than approximately 25 nm, it may affect the subsequent formation of the pocket regions in the base substrate 200 at both sides of the gate structures 201.

Further, as shown in FIG. 3, first sidewall spacers 111 may be formed on the sidewall surfaces of the gate structures 201. The first sidewall spacers may be made of silicon nitride, etc. The first sidewall spacers may be used to define the positions of the subsequently formed pocket regions; and may also be used to protect the sidewall surfaces of the gate structures 201.

Figure 4:
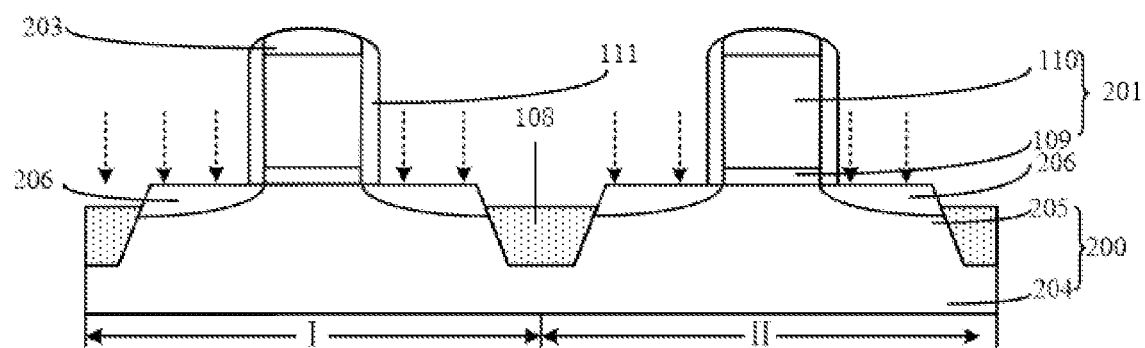

Returning to FIG. 13, after providing the base substrate with the certain structures, pocket regions may be formed (S102). FIG. 4 illustrates a corresponding semiconductor structure.

As shown in FIG. 4, pocket regions 206 are formed in the fins 205 at both sides of each of the gate structures 201. That is, one pocket region 206 is formed in the fin 205 at each side of each of the gate structures 201. The pocket regions 206 may be formed by any appropriate process, such as an ion implantation process, etc.

The thickness of the mask layer 203 may be relatively small; and the size of the first sidewall spacers along the direction perpendicular to the sidewall surfaces of the gate structures 201 may be relatively small. Thus, the depth-to-width ratio of the trenches (not labeled) formed by the adjacent gate structures 201, the first sidewall spacers and the mask layer 203 may be relatively small. During the ion implantation process for forming the pocket regions 206, the ions may be less affected by the shadow effect. Thus, the ions may be easily implanted into the base substrate 200 under the gate structures 201; and the pocket regions 206 may be relatively easy to form; and the performance of the pocket regions 206 may be as desired.

Figure 5:
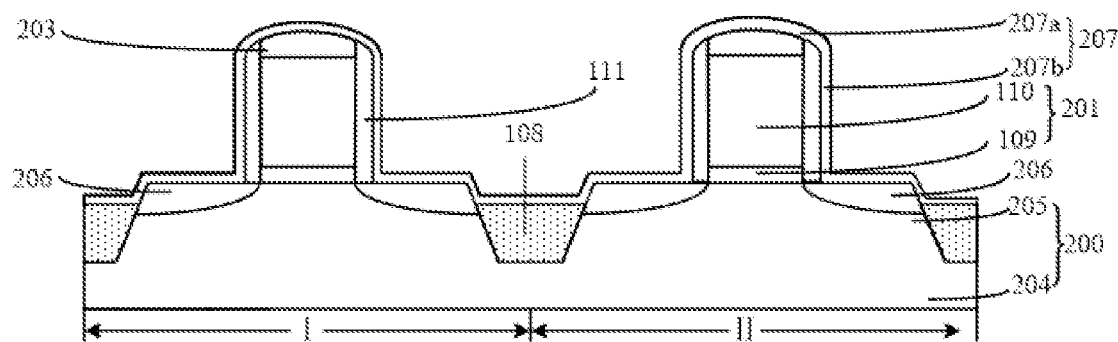

Returning to FIG. 13, after forming the pocket regions, a protective layer may be formed (S103). FIG. 5 illustrates a corresponding semiconductor structure.

As shown in FIG. 5, a protective layer 207 is formed on the base substrate 200, the mask layer 203 and the first sidewall spacers. The protective layer 207 may include a first protective portion 207a on the mask layer 203; and a second protective portion 207b on the base substrate 200 and the first sidewall spacers.

Various processes may be used to form the protective layer 207, such as a CVD process, or a PVD process, etc. In one embodiment, the protective layer 207 is formed by a CVD process. The protective layer 207 may be made of any appropriate material, such as silicon oxide, silicon nitride, or silicon oxynitride, etc. In one embodiment, the protective layer 207 is made of silicon nitride.

The thickness of the protective layer 207 may be in a range of approximately 2 nm-7 nm. If the thickness of the protective layer 207 is smaller than approximately 2 nm, the first protective portion 207a may be unable to sufficiently protect the gate structures 201.

Accordingly, during subsequently forming doped source/drain regions, the mushroom-shaped defects may be easily formed on the gate structures 201; and the performance of the semiconductor structure may be uneasy to improve. If the thickness of the protective layer 207 is greater than approximately 10 nm, the difficulty of the subsequent processes may be increased.

In one embodiment, the thickness of the first protective portion 207a may be in a range of approximately 2 nm-10 nm. The size of the portion of the second protective portion 207b on the base substrate along the direction perpendicular to the surface of the base substrate 200 may be in a range of approximately 2 nm-10 nm. The size of the portion of the second protective portion 207b on the sidewall spacers along the direction perpendicular to the first sidewall spacers may be in a range of approximately 2 nm-10 nm.

Doped source/drain regions may be subsequently formed in the fins 205 at both sides of each of the gate structures 201. The first protection portion 207a may entirely cover the top surface of the mask layer 203. The first protective portion 207a and the mask layer 203 may be used to protect the top surfaces of the gate structures 201 to prevent forming mushroom-shaped defects on the top surfaces of the gate structures 201. Accordingly, the performance of the semiconductor structure may be improved.

In one embodiment, before forming the doped source/drain regions, the second protective portion 207b may be removed. The process for removing the second protective portion 207b are described as following in FIGS. 6-10. In some embodiments, the second protective portion may be retained.

Figure 6:
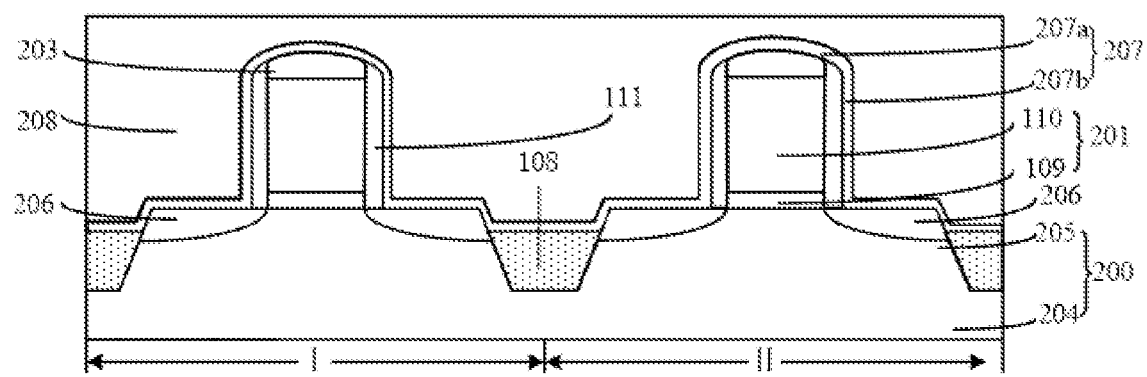

Returning to FIG. 13, after forming the protective layer, a sacrificial film may be formed (S104). FIG. 6 illustrates a corresponding semiconductor structure.

As shown in FIG. 6, a sacrificial film 208 is formed on the protective layer 207. The sacrificial film 208 may be used to subsequently form a sacrificial layer.

The sacrificial film 208 may be made of any appropriate material. In one embodiment, the sacrificial film 208 is made of a bottom antireflective coating material.

In some embodiments, the sacrificial film may be optional.

Figure 7:
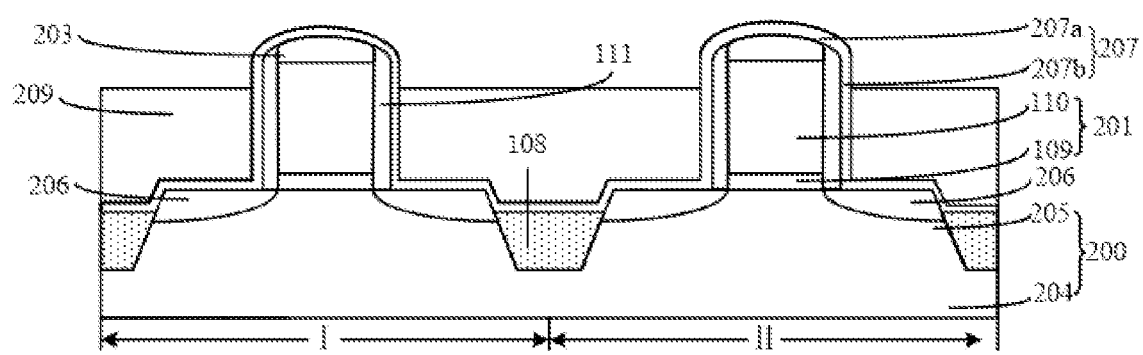

After forming the sacrificial film 208, as shown in FIG. 7, a sacrificial layer 209 may be formed by removing portions of the sacrificial film 208 (referring to FIG. 6). The sacrificial layer 209 may expose the first protective portion 207a.

Various processes may be used to remove portions of the sacrificial film 208, such as a dry etching process, a wet etching process, or a combination of a dry etching process and a wet etching process, etc. In one embodiment, a wet etching process is used to remove the portions of the sacrificial film 208 to form the sacrificial layer 209.

The thickness of the sacrificial layer 209 may be in a range of approximately 40 nm-150 nm. If the thickness of the sacrificial layer 209 is greater than approximately 150 nm, the amount of the portions of the first protective portion 207a exposed by the sacrificial layer 209 may be relatively small. Thus, the amount of the ions subsequently doped in the first protective portion 207a may be relatively small. Accordingly, the amount of the second protective portion 207a removed by the subsequent process may be relatively large; and the first protective portions 207a may be unable to sufficiently protect the gate structures 201. Thus, during subsequently forming the doped source/drain regions, the mushroom-shaped defects may be easily formed on the gate structures 201; and it may be uneasy to improve the performance of the semiconductor structure. If the thickness of the sacrificial layer 209 is smaller than approximately 40 nm, during subsequently doping the ions in the first protective portion 207a, the fins 205 under the sacrificial layer 209 may be easily damaged; and it may be uneasy to improve the performance of the semiconductor structure.

Figure 8:
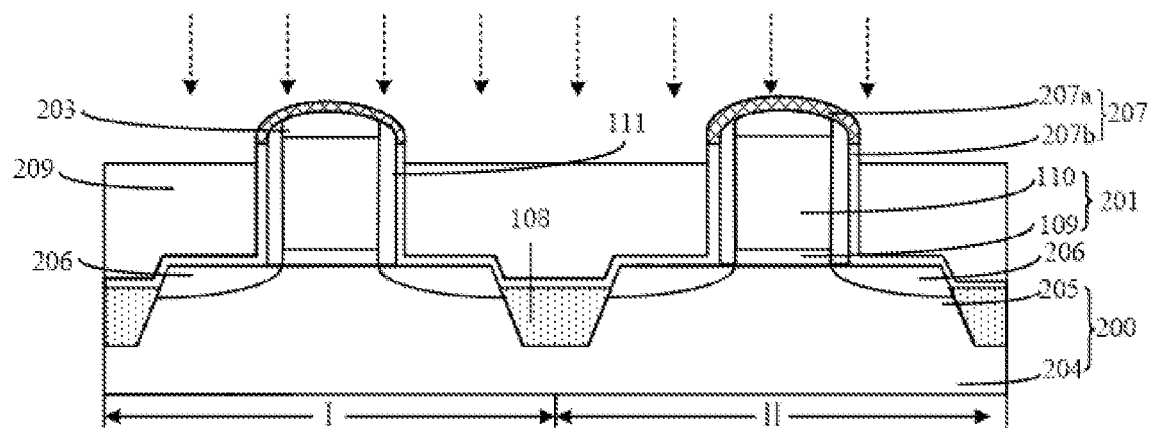

Returning to FIG. 13, after forming the sacrificial layer, a doping process may performed on the first protective portion (S105). FIG. 8 illustrates a corresponding semiconductor structure.

As shown in FIG. 8, a doping process is performed on the first protective portion 207a.

The doping process may be any appropriate process. In one embodiment, an ion implantation process is used to dope the first protective portions 207a. The doping ions of the ion implantation process may include silicon ions, arsenic ions, boron ions, phosphor ions, carbon ions, germanium ions, or $BF_2$ ions, etc. The dosage of the ion implantation process may be in a range of approximately 1E12 atom/cm$^2$-1E16 atom/cm$^2$. The implanting depth may be in a range of approximately 1 nm-10 nm.

If the dosage of the ion implantation process is smaller than approximately 1E12 atom/cm$^2$, the etching selectivity ratio between the first protective portion 207a and the second protective portion 207b may be relatively small. During subsequently removing the second protective portion 207b, the damage to the first protective portion 207a may be severe; and the thickness of the first protective portion 207a may be substantially small. Accordingly, the first protective portion 207a may be unable to sufficiently protect the gate structures 201. During subsequently forming the doped source/drain regions, mushroom-shaped defects may be easily formed on the gate structures 201; and it may be uneasy to improve the performance of the semiconductor structure. If the dosage of the ion plantation process is greater than approximately 1E16 atom/cm$^2$, it may be easy to physically damage the gate structures 201.

The first protective portion 207a may be made of silicon nitride; and may be doped by the ion implantation process. The second protective portion 207b may be made of silicon nitride. Thus, the first protective portion 207a and the second protective portion 207b may have different etching selectivity; and the anti-etching ability of the first protective portion 207a may be greater than the anti-etching ability of the second protective portion 207b.

Figure 9:
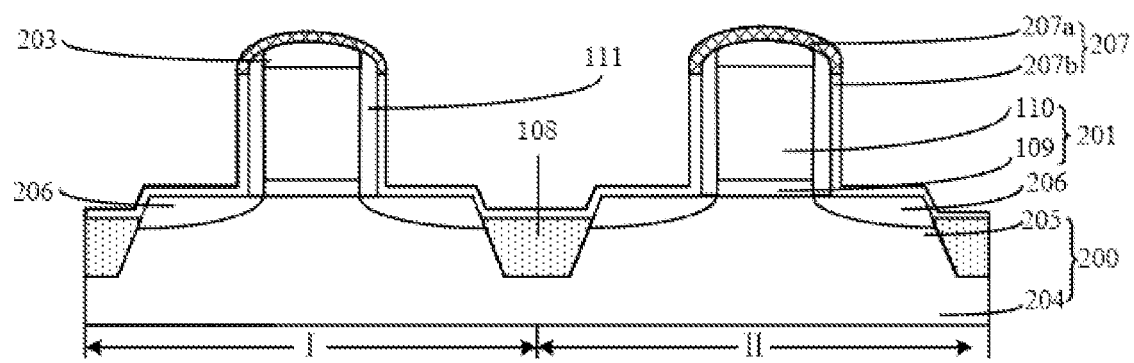

Returning to FIG. 13, after performing the doping process, the sacrificial layer may be removed (S106). FIG. 9 illustrates a corresponding semiconductor structure.

As shown in FIG. 9, the sacrificial layer 209 (referring to FIG. 8) is removed; and the surface of the second protective portion 207b may be exposed.

The sacrificial layer 209 may be removed by any appropriate process, such as a dry etching process, a wet etching process, or a combination of a dry etching process and a wet etching process, etc. In one embodiment, a plasma ashing process is used to remove the sacrificial layer 209.

Figure 10:
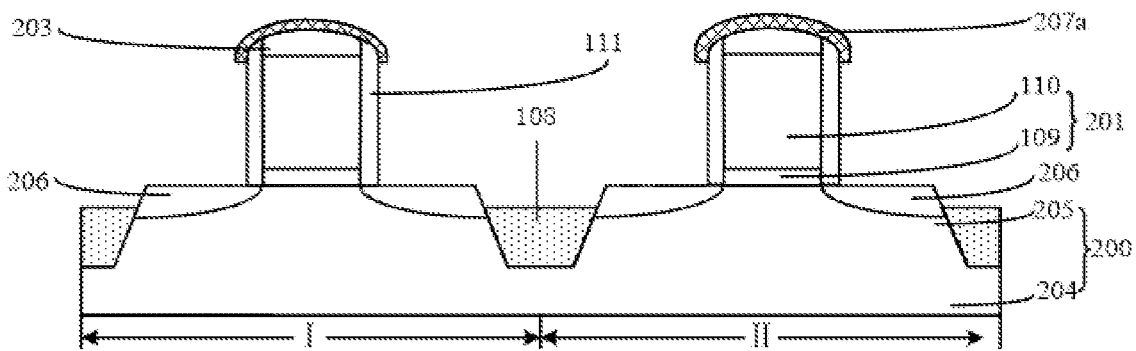

Returning to FIG. 13, after removing the sacrificial layer, the second protective portion may be removed (S107). FIG. 10 illustrates a corresponding semiconductor structure.

As shown in FIG. 10, the second protective portion 207b (referring to FIG. 9) is removed; and portions of the surface of the base substrate 200 and the sidewall surfaces of the gate structures 201 are exposed.

The second protective portion 207b may be removed by any appropriate process, such as a dry etching process, a wet etching process, or a combination of a dry etching process and a wet etching process, etc.

Removing the second protective portion 207b on the sidewall surfaces of the gate structures 201 may reduce the distance between the doped source/drain doping regions subsequently formed in the fins 205 at both sides of a corresponding gate structure 201; and the stress on the channel regions under the gate structure applied by the doped source/drain regions may be sufficiently strong. Accordingly, the performance of the transistors may be enhanced. Further, removing the second protective portion 207b on the sidewall surfaces of the gate structures 201 may facilitate to reduce the resistance of the transistors.

Referring to FIG. 10, after removing the second protective portion 207b, the first protective portion 207a may protrude from the sidewall surfaces of the gate structures 201. Such a protruding structure may extend the process window for subsequently forming the doped source/drain regions.

Returning to FIG. 13, after removing the second protective portion, first doped source/drain regions may be formed in the fins in the first region I at both sides of the gate structure (S108). FIG. 11 illustrates a corresponding semiconductor structure.

As shown in FIG. 11, first doped source/drain regions 211 are formed in the fins 205 in the first region I at both sides of the gate structure 201.

Before forming the doped source/drain regions 211, second sidewall spacers 112 may be formed on the sidewall surfaces of the gate structure 201 in the first region I. The second sidewall spacers may be formed on the sidewall surfaces of the first sidewall spacers.

Further, after forming the second sidewall spacers and before forming the first doped source/drain regions 211, a first capping film may be formed on the base substrate, and the top surfaces and the sidewall surfaces of the gate structures 201. Then, the portions of the first capping film on the base substrate 200 in the first region I, and the top surface and the sidewall surfaces of the gate structure 201 in the first region I may be removed to form a first capping layer 212 (as shown in FIG. 11).

The first capping film may be made of any appropriate material. In one embodiment, the first capping film is made of silicon nitride. Accordingly, the first capping layer 212 may also be made of silicon nitride.

Various processes may be used to remove the portions of the first capping film on the base substrate 200 and the sidewall surfaces and the top surface of the gate structure 201 in the first region I. In one embodiment, a wet etching process is used to remove the portions of the first capping film on the base substrate 200 and the sidewall surfaces and the top surface of the gate structure 201 in the first region I. The etching solution of the wet etching process may be a phosphorous acid solution; and the temperature of the wet etching process may be in a range of approximately 30° C.-100° C.

During the process for removing the portions of the first capping film on the base substrate 200 and the sidewall surfaces and the top surface of the gate structure 201 in the first region I, the first protective portion 207a and the mask layer 203 may be able to protect the top surface of the gate structure 201 in the first region I; and the first sidewall spacers and the second sidewall spacers may protect the sidewall surfaces of the gate structure 201. Thus, the sidewall surfaces and the top surface of the gate structure 201 in the first region I may not be both exposed.

A process for forming the first doped source/drain regions 211 may include forming first trenches (not labeled) in the fins 205 at both sides of the gate structure 201 in the first region I; forming a first epitaxial layer in the first trenches; and performing an N-type doping process on the first epitaxial layer. In some embodiments, the first doped source/drain regions may be formed by an ion implantation process.

The first trenches may be formed by any appropriate process. In one embodiment, a dry etching process is used to form the first trenches.

Various processes may be used to form the first epitaxial layer. In one embodiment, a first epitaxial growth process is used to form the first epitaxial layer. The first epitaxial layer may be made of any appropriate material, such as silicon, or silicon carbide, etc.

During the process for forming the first trenches, the first protective portion 207a and the mask layer 203 may be able to protect the top surface of the gate structure 201 in the first region I. Thus, the top surface of the gate structure 201 in the first region I may not be exposed.

Accordingly, when forming the first epitaxial layer in the first openings, the gate structure 201 in the first region I may not have an epitaxial growth. That is, the mushroom-shaped defects may not be formed on the top surface of the gate structure 201 in the first region I. Thus, the morphology of the first gate structure 201 in the first region I may be as desired; and the performance of the semiconductor structure may be improved.

Returning to FIG. 13, after forming the first doped source/drain regions, second doped source/drain regions may be formed (S109). FIG. 12 illustrates a corresponding semiconductor structure.

As shown in FIG. 12, second doped source/drain regions 213 are formed in fins 201 at both sides of the gate structure 201 in the second region II.

In one embodiment, the second doped source/drain regions 213 may be formed after forming the first doped source/drain regions 211. In some embodiments, the second doped source/drain regions may be formed before forming the first doped source/drain regions.

Before forming the second doped source/drain regions 213, referring to FIG. 12, the second sidewall spacers may formed on the sidewall surfaces of the gate structure 201 in the second region II. The second sidewall spacers may be formed on the sidewall surfaces of the first sidewall spacers.

Further, after forming second sidewall spacers and before forming the second doped source/drain regions 213, a second capping film may be formed on the base substrate 200, the side and top surfaces of the gate structures 201. Then, the portions of the second capping film on the base substrate 200 in the second region II and on the top surface and the sidewall surfaces of the gate structure 201 in the second region II may be removed; and the second capping layer 214 may be formed.

The second capping film may be made of any appropriate material. In one embodiment, the second capping film is made of silicon nitride. Accordingly, the second capping layer 214 may also be made of silicon nitride.

Various processes may be used to remove the portions of the second capping film on the base substrate 200 and the sidewall surfaces and the top surface of the gate structure 201 in the second region II. In one embodiment, a wet etching process is used to remove the portions of the second capping film on the base substrate 200 and the sidewall surfaces and the top surface of the gate structure 201 in the second region II. The etching solution of the wet etching process may be a phosphorous acid solution; and the temperature of the wet etching process may be in a range of approximately 30° C.-100° C.

During the process for removing the portions of the second capping film on the base substrate 200 and the sidewall surfaces and the top surface of the gate structure 201 in the second region II, the first protective portion 207a and the mask layer 203 may be able to protect the top surface of the gate structure 201 in the second region II; and the first sidewall spacers and the second sidewall spacers may protect the sidewall surfaces of the gate structure 201. Thus, the sidewall surfaces and the top surface of the gate structure 201 in the second region II may be both not exposed.

A process for forming the second doped source/drain regions 213 may include forming second trenches (not labeled) in the fins 201 at both sides of the gate structure 201 in the second region II; forming a second epitaxial layer in the second trenches; and performing a P-type doping process on the second epitaxial layer. In some embodiments, the second doped source/drain regions may be formed by an ion implantation process.

The second trenches may be formed by any appropriate process. In one embodiment, a dry etching process is used to form the second trenches.

Various processes may be used to form the second epitaxial layer. In one embodiment, a second epitaxial growth process is used to form the second epitaxial layer. The second epitaxial layer may be made of any appropriate material, such as silicon, or silicon germanium, etc.

During the process for forming the second trenches, the first protective portion 207a and the mask layer 203 may be able to protect the top surface of the gate structure 201 in the second region II. Thus, the top surface of the gate structure 201 in the second region II may not be exposed. Accordingly, when forming the second epitaxial layer in the second trenches, the gate structure 201 in the second region II may not have an epitaxial growth. That is, the mushroom-shaped defects may not be formed on the top surface of the gate structure 201 in the second region II. Thus, the morphology of the gate structure 201 in the second region II may be as desired; and the performance of the semiconductor structure may be improved.

The present disclosure also provides a semiconductor structure. A corresponding semiconductor structure is illustrated in FIG. 12.

As shown in FIG. 12, the semiconductor structure includes a base substrate 200 having a first region I and a second region II. The base substrate may include a semiconductor substrate 204 and a plurality of fins 205 on the base substrate 200. The semiconductor structure may also include a gate structure 201 formed over the base substrate 200 in the first region I and a gate structure 201 formed over the base substrate 200 in the second region II. Further, the semiconductor structure may include a first protective portion 207a protruding from sidewall surfaces of the gate structures 201 formed on the top surfaces of the gate structures 201; and first sidewall spacers 111 on the sidewall surfaces of the gate structures 201; and second sidewall spacers 112 on the sidewall surfaces of the first sidewall spacers. Further, the semiconductor structure may include pocket regions 206 formed in the base substrate 200 at both sides of the gate structures 201; and first doped source/drain regions 211 in the base substrate 200 at both sides of the gate structure 201 in the first region I; and second doped source/drain regions 213 at both sides of the gate structure 201 in the second region II. The detailed structures and intermediate structures are described above with respect to the fabrication processes.

In the disclosed method, before forming the first protective portion on the mask layer, pocket regions may be formed in the base substrate at both sides of the gate structures. When forming the pocket regions, because the top surfaces of the gate structure may only be covered by the mask layer, comparing with the depth-width-ratio of the trenches formed by the adjacent gate structures, the mask layer and the first protection portion, the depth-to-width ratio of the trenches formed by the adjacent gate structures and the mask layer may be relatively small. During the ion implantation process for forming the pocket regions, the ions may receive substantially small shadow effect. Thus, the ions may be easily implanted into the base substrate under the gate structures; and it may be relatively easy to form the pocket regions; and the performance of the pocket regions may be as desired.

After forming the pocket regions, the first protective portion may be formed on the mask layer. When forming the first doped source/drain regions and the second doped source/drain regions, the first protective portion may be able to protect the top surfaces of the gate structures; and may effectively prevent the portions of the top surfaces of the gate structures from being exposed. Thus, when forming the material layer of the doped source/drain regions, no by-products may be formed on the top surface of the gate structures; and the morphology of the gate structures may be as desired. Accordingly, the performance of the semiconductor structure may be improved.

Further, the first protective portion may protrude from the sidewall surfaces of the gate structures. The process window for subsequently forming the doped source/drain regions may be increased.

Further, the second protective portion on the base substrate and the sidewall surfaces of the gate structures may be removed. Thus, the distance between the source/drain doping regions may be reduced. Accordingly, the contact resistance of the semiconductor structure may be reduced.

Further, to remove the second protective portions on the base substrate and the sidewall surfaces of the gate structures, the first protective portion may be doped. Before doping the first protective portion, a sacrificial layer may be formed on the second protective portion. The first protective layer may be doped by an ion implantation process. During the ion implantation process, the sacrificial layer may be used to protect the base substrate; and may be able to prevent the high energy ions from damaging the base substrate. Accordingly, the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a base substrate;
    forming a gate structure over the base substrate;
    forming a mask layer on a top surface of the gate structure;
    forming pocket regions in the base substrate at both sides of the gate structure;
    after forming the pocket regions, forming a first protective portion covering a top surface of the mask layer, exposing sidewall surfaces of the gate structure, and protruding from the sidewall surfaces of the gate structure, wherein forming the first protective portion comprises:
        forming a protective layer over the base substrate, the mask layer and sidewall surfaces of the gate structure, wherein:
        the protective layer includes the first protective portion over the mask layer and a second protective portion over the base substrate and the sidewall surfaces of the gate structure,
        the protective layer is made of silicon nitride, and
        a thickness of the protective layer is in a range of approximately 2 nm-10 nm;
    removing the second protective portion; and
    after forming the first protective portion, forming doped source/drain regions in the base substrate and portions of the pocket regions at both sides of the gate structure.

2. The method according to claim 1, wherein:
    the mask layer is made of silicon nitride; and
    a thickness of the mask layer is in a range of approximately 3 nm-25 nm.

3. The method according to claim 1, further comprising:
    doping the first protective portion before removing the second protective portion.

4. The method according to claim 3, wherein:
    the first protective portion is doped by a first ion implantation process;
    doping ions of the first ion implantation process include one of silicon ions, arsenic ions, boron ions, phosphor ions, carbon ions, germanium ions and $BF_2$ ions;
    a dosage of the first ion implantation process is in a range of approximately 1E12 atom/cm$^2$-1E16 atom/cm$^2$; and
    an implanting depth is in a range of approximately 1 nm-10 nm.

5. The method according to claim 3, before forming doping the first protective portion, further comprising:
    forming a sacrificial layer on the second protective portion and exposing the top surface of the first protective portion, wherein: a thickness of the sacrificial layer is in a range of approximately 40 nm-150 nm.

6. The method according to claim 1, wherein:
    the base substrate include a first region and a second region;

a plurality of gate structures, including the gate structure, are formed on the base substrate in the first region and the second region, respectively;

the doped source/drain regions in the base substrate at both sides of each gate structure in the first region are first doped source/drain regions;

the doped source/drain region in the base substrate at both sides of each gate structure in the second region are second doped source/drain regions;

the first region is used to form an NMOS transistor; and the second region is used to form a PMOS transistor.

7. The method according to claim 6, after forming the first protective portion and before forming the first doped source/drain regions, further comprising:

forming a first capping film on the base substrate, top surfaces and sidewall surfaces of the gate structures; and removing portions of the first capping film on the base substrate in the first region and on the top and sidewall surfaces of the gate structure in the first region to form a first capping layer, wherein the first capping layer is made of silicon nitride.

8. The method according to claim 7, wherein:

a wet etching process is used to remove the portions of the first capping film on the base substrate in the first region and on the top and sidewall surfaces of the gate structure in the first region to form the first capping layer, wherein:

an etching solution of the wet etching process includes a phosphorus solution; and a temperature of the wet etching process is in a range of approximately 30° C.-100° C.

9. The method according to claim 6, wherein forming the first doped source/drain regions comprises:

forming first trenches in the base substrate at both sides of the gate structure in the first region;

forming a first epitaxial layer in the first trenches; and performing an N-type doping process on the first epitaxial layer.

10. The method according to claim 6, after forming the first doped source/drain regions and before forming the second doped source/drain regions, further comprising:

forming a second capping film on the base substrate, top surface and sidewall surfaces of the gate structures; and removing portions of the second capping film on the base substrate in the second region and on the top and sidewall surfaces of the gate structure in the second region to form a second capping layer, wherein the second capping layer is made of silicon nitride.

11. The method according to claim 6, wherein forming the second doped source/drain regions comprises:

forming second trenches in the base substrate at both sides of the gate structure in the second region;

forming a second epitaxial layer in the second trenches; and performing a P-type doping process on the second epitaxial layer.

12. A method for fabricating a semiconductor structure, comprising:

providing a base substrate;

forming a gate structure over the base substrate;

forming a mask layer on a top surface of the gate structure;

forming pocket regions in the base substrate at both sides of the gate structure;

after forming the pocket regions, forming a first protective portion covering a top surface of the mask layer and protruding from sidewall surfaces of the gate structure, wherein forming the first protective portion comprises:

forming a protective layer over the base substrate, the mask layer and sidewall surfaces of the gate structure, wherein:

the protective layer includes the first protective portion over the mask layer and a second protective portion over the base substrate and the sidewall surfaces of the gate structure, the protective layer is made of silicon nitride, and a thickness of the protective layer is in a range of approximately 2 nm-10 nm;

forming a sacrificial layer on the second protective portion and exposing the top surface of the first protective portion, wherein: a thickness of the sacrificial layer is in a range of approximately 40 nm-150 nm;

removing the sacrificial layer;

doping the first protective portion;

removing the second protective portion; and after forming the first protective portion, forming doped source/drain regions in the base substrate and portions of the pocket regions at both sides of the gate structure.

13. The method according to claim 12, wherein:

the base substrate include a first region and a second region;

a plurality of gate structures, including the gate structure, are formed on the base substrate in the first region and the second region, respectively;

the doped source/drain regions in the base substrate at both sides of each gate structure in the first region are first doped source/drain regions;

the doped source/drain region in the base substrate at both sides of each gate structure in the second region are second doped source/drain regions;

the first region is used to form an NMOS transistor; and the second region is used to form a PMOS transistor.

14. The method according to claim 13, after forming the first protective portion and before forming the first doped source/drain regions, further comprising:

forming a first capping film on the base substrate, top surfaces and sidewall surfaces of the gate structures; and removing portions of the first capping film on the base substrate in the first region and on the top and sidewall surfaces of the gate structure in the first region to form a first capping layer, wherein the first capping layer is made of silicon nitride.

15. The method according to claim 14, wherein:

a wet etching process is used to remove the portions of the first capping film on the base substrate in the first region and on the top and sidewall surfaces of the gate structure in the first region to form the first capping layer, wherein:

an etching solution of the wet etching process includes a phosphorus solution; and a temperature of the wet etching process is in a range of approximately 30° C.-100° C.

16. The method according to claim 13, wherein forming the first doped source/drain regions comprises:

forming first trenches in the base substrate at both sides of the gate structure in the first region;

forming a first epitaxial layer in the first trenches; and performing an N-type doping process on the first epitaxial layer.

17. The method according to claim 13, after forming the first doped source/drain regions and before forming the second doped source/drain regions, further comprising:
- forming a second capping film on the base substrate, top surface and sidewall surfaces of the gate structures; and
- removing portions of the second capping film on the base substrate in the second region and on the top and sidewall surfaces of the gate structure in the second region to form a second capping layer, wherein the second capping layer is made of silicon nitride.

18. The method according to claim 13, wherein forming the second doped source/drain regions comprises:
- forming second trenches in the base substrate at both sides of the gate structure in the second region;
- forming a second epitaxial layer in the second trenches; and
- performing a P-type doping process on the second epitaxial layer.

19. The method according to claim 13, wherein:
- the mask layer is made of silicon nitride; and
- a thickness of the mask layer is in a range of approximately 3 nm-25 nm.

* * * * *